US012603753B2

(12) United States Patent
Zhu et al.

(10) Patent No.: US 12,603,753 B2
(45) Date of Patent: Apr. 14, 2026

(54) SIGNAL TRANSMITTING METHOD, ELECTRONIC DEVICE, AND COMMUNICATION SYSTEM

(71) Applicant: Montage Technology (Kunshan) Co., Ltd., Suzhou (CN)

(72) Inventors: Wei Zhu, Suzhou (CN); Gang Yan, Suzhou (CN); Xiaoliang Xu, Suzhou (CN); Bibo Ping, Suzhou (CN)

(73) Assignee: Montage Technology (Kunshan) Co., Ltd., Suzhou (CN)

( * ) Notice: Subject to any disclaimer, the term of this patent is extended or adjusted under 35 U.S.C. 154(b) by 41 days.

(21) Appl. No.: 18/898,590

(22) Filed: Sep. 26, 2024

(65) Prior Publication Data

US 2025/0175197 A1 May 29, 2025

(30) Foreign Application Priority Data

Nov. 23, 2023 (CN) .......................... 202311575619.0

(51) Int. Cl.
| | |
|---|---|
| *H04L 7/04* | (2006.01) |
| *H03M 13/19* | (2006.01) |
| *H04L 1/00* | (2006.01) |
| *H04L 1/20* | (2006.01) |

(52) U.S. Cl.
CPC ............ *H04L 7/041* (2013.01); *H03M 13/19* (2013.01); *H04L 1/0057* (2013.01); *H04L 1/205* (2013.01)

(58) Field of Classification Search
CPC ......... H04L 1/205; H04L 7/041; G11C 7/222; G11C 11/4076; G06F 1/04; G06F 1/08; G06F 1/12
See application file for complete search history.

(56) References Cited

U.S. PATENT DOCUMENTS

| | | | |
|---|---|---|---|
| 6,691,214 B1 * | 2/2004 | Li | G11C 7/1078 713/400 |
| 2009/0161452 A1 * | 6/2009 | Wang | G11C 7/1078 365/193 |
| 2016/0260465 A1 * | 9/2016 | Fung | G11C 7/222 |
| 2019/0198085 A1 * | 6/2019 | Best | G11C 11/4076 |

* cited by examiner

*Primary Examiner* — Shelly A Chase
(74) *Attorney, Agent, or Firm* — IPRTOP LLC

(57) ABSTRACT

A signal transmitting method, an electronic device, and a communication system are provided. The signal transmitting method comprises: transmitting, by a transmitting terminal, a DQ redundancy code and a DQS preamble code to a receiving terminal during a preamble period, the DQ redundancy code is configured with a specific pattern such that jitter of a DQ signal tracks jitter of a DQS signal, and when the DQ redundancy code has the specific pattern, the lowest n bits of a pattern of the DQ redundancy code match the lowest n bits of a pattern of the DQS preamble code, where n is an integer greater than or equal to two; transmitting, by the transmitting terminal, the DQ signal and the DQS signal to the receiving terminal during a data transmission period. The signal transmitting method of the present disclosure helps to reduce timing loss.

9 Claims, 11 Drawing Sheets

Transmitting, by a transmitting terminal, a DQ redundancy code and a DQS preamble code to a receiving terminal during a preamble period ⟋ S21

Transmitting, by the transmitting terminal, the DQ signal and the DQS signal to the receiving terminal during a data transmission period ⟋ S22

SIGNAL TRANSMITTING METHOD, ELECTRONIC DEVICE, AND COMMUNICATION SYSTEM

FIELD OF THE INVENTION

The present disclosure belongs to the field of communication technologies, and relates to signal transmission, and in particular to a signal transmitting method, an electronic device, and a communication system.

BACKGROUND OF THE INVENTION

In a source synchronous clock transmission system, the transmitting terminal simultaneously transmits both the sampling clock signal and the data signal to the receiving terminal. The receiving terminal then uses the received sampling clock signal to sample the data signal. Source synchronous clock transmission systems provide highly accurate clock synchronization, ensuring precise data sampling and transmission. However, in practical applications, the receiving terminal often encounters timing loss, which can lead to differences between the received data and the expected data in terms of timing. In severe cases, this misalignment may result in data loss or incorrect reception, affecting the overall reliability of communication.

SUMMARY OF THE INVENTION

Embodiments of the present disclosure provide a signal transmitting method, an electronic device, and a communication system, which reduce timing loss of source synchronous clock transmission systems.

A first aspect of the present disclosure provides a signal transmitting method, comprising: transmitting, by a transmitting terminal, a DQ redundancy code and a DQS preamble code to a receiving terminal during a preamble period. The DQ redundancy code is configured with a specific pattern such that jitter of a DQ signal tracks jitter of a DQS signal. When the DQ redundancy code has the specific pattern, the lowest n bits of a pattern of the DQ redundancy code match the lowest n bits of a pattern of the DQS preamble code, where n is an integer greater than or equal to two. The signal transmitting method further comprises transmitting, by the transmitting terminal, the DQ signal and the DQS signal to the receiving terminal during a data transmission period.

In one embodiment of the first aspect, a channel between the transmitting terminal and the receiving terminal is a linear time-invariant channel, and the jitter of the DQ signal comprises basic jitter corresponding to basic pattern and additional jitter corresponding to other patterns. The transmitting terminal is provided with a register to configure the DQ redundancy code with the specific pattern, to reduce jitter difference between the DQ signal and the DQS signal in terms of the basic jitter and the additional jitter, respectively.

In one embodiment of the first aspect, the pattern of the DQ redundancy code and the pattern of the DQS preamble code are stored in a register, and the signal transmitting method further comprises obtaining the pattern of the DQ redundancy code and the pattern of the DQS preamble code from the register.

In one embodiment of the first aspect, n is an integer greater than two.

In one embodiment of the first aspect, the pattern of the DQS preamble code is 00001010, and the lowest two bits of the pattern of the DQ redundancy code are 10.

In one embodiment of the first aspect, the pattern of the DQS preamble code is 00001010, and the pattern of the DQ redundancy code is 00001010 or 00010010.

In one embodiment of the first aspect, the signal transmitting method is applied to a source synchronous clock transmission system.

A second aspect of the present disclosure provides an electronic device, comprising: a memory, on which a computer program is stored; and a processor, communicatively connected to the memory and configured to call the computer program to perform a signal transmitting method according to any one of the embodiments provided in the first aspect.

A third aspect of the present disclosure provides a communication system, comprising: a transmitting terminal, configured to transmit signals to a receiving terminal by adopting a signal transmitting method according to any one of the embodiments provided in the first aspect; and the receiving terminal, configured to receive the signals from the transmitting terminal.

The signal transmitting method of the present disclosure configures the DQ redundancy code with the specific pattern, by making at least the lowest two bits of the pattern of the DQ redundancy code match the lowest two bits of the pattern of the DQS preamble code, which allows the jitter of the DQ signal to track the jitter of the DQS signal, reducing the jitter difference between the DQ signal and the DQS signal and minimizing timing loss of the receiving terminal.

DETAILED DESCRIPTION OF THE INVENTION

The embodiments of the present disclosure will be described below. Those skilled can easily understand other advantages and effects of the present disclosure according to contents disclosed by the specification. The present disclosure can also be implemented or applied through other different specific embodiments. Various details in this specification can also be modified or changed based on different viewpoints and disclosures without departing from the spirit of the present disclosure. It should be noted that the following embodiments and features of the following embodiments can be combined with each other if no conflict will result.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the layout of the components can also be more complicated.

Figure 1A:
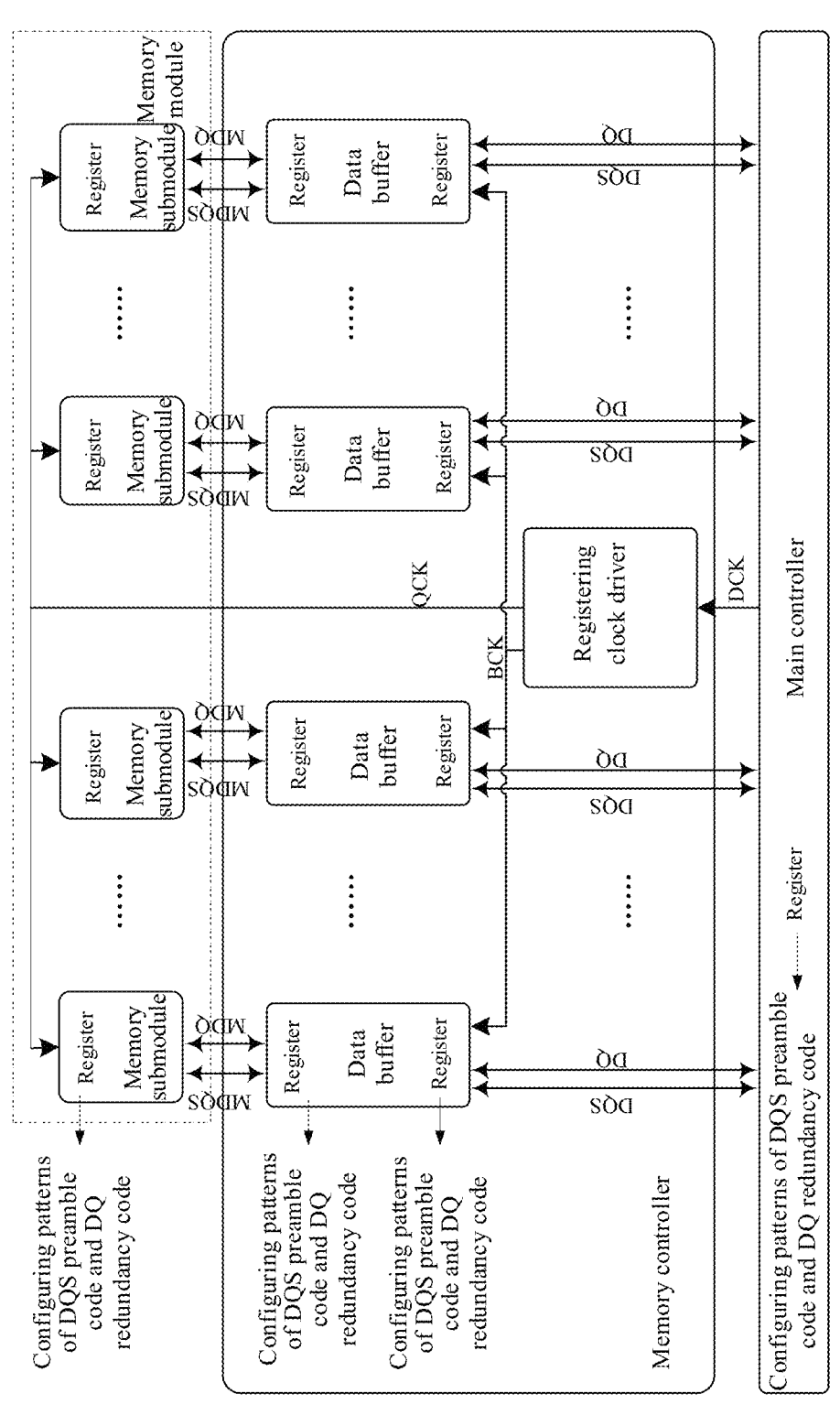
FIG. 1A is a diagram showing a double data rate (DDR) memory subsystem according to an embodiment of the present disclosure.

A source synchronous clock transmission system can be applied in a double-data-rate (DDR) memory subsystem. FIG. 1A is a diagram showing a DDR memory subsystem according to an embodiment of the present disclosure. As shown in FIG. 1A, the DDR memory subsystem comprises a memory controller and a memory module.

The memory module consists of multiple memory submodules, and each memory submodule comprises one or more memory chips. In some embodiments, the memory module may be a memory system compliant with JEDEC double-rate synchronous dynamic random access memory (SDRAM) standard, such as DDR1, DDR2, DDR3, DDR4, DDR5, and other DDR memory standards. Additionally, the memory module may also be an internal memory compliant with other standards or protocols, such as SDRAM or RAMBUS internal memory, or may be a memory compliant with future memory standards. In some embodiments, the memory module may comprise volatile memories (e.g., dynamic random-access memories) or non-volatile memories (e.g., NAND or NOR flash memories) or a combination of both. In other embodiments, the memory module may also consist of innovative memory types produced using various manufacturing processes, such as magnetic resistive memories, phase-change memories, resistive memories, half-floating gate memories, or any other memory variant.

The memory controller coordinates and manages data read and write operations. Its primary functions include timing control, data scheduling, address generation, and data buffering. The memory controller comprises a registering clock driver and multiple data buffers.

The registering clock driver generates and maintains precise clock signals, ensuring that memory operations and data transfers occur at the correct moments. These clock signals synchronize the various components within the DDR memory subsystem. The registering clock driver is connected between a main controller and the memory module, receiving DCK signals from the main controller. The DCK signals represent DDR clock signals used to transmit commands and address information from the main controller to the registering clock driver. Based on the DCK signals, the registering clock driver generates QCK signals (i.e., storage clock signals) and BCK signals (i.e., data buffer clock signals). These signals are transmitted to the memory module and the data buffers, synchronizing the components.

The data buffers buffer and manage data to ensure efficient memory operations. The data buffers have storage capacity to temporarily hold data read from memory, allowing faster access for other components, which helps reduce memory access latency and improves system responsiveness. The data buffers facilitate data exchange between the main controller and the corresponding memory submodules. Communication between one of the data buffers and its corresponding memory submodule, as well as between the data buffer and the main controller, can be achieved using source synchronous clock transmission. For instance, when communicating between the main controller and one of the data buffers, a transmitting terminal (e.g., the main controller) uses a data strobe (DQS) signal as a sampling clock signal and transmits it along with a data (DQ) signal to a receiving terminal (e.g., the data buffer), which samples the DQ signal based on the received DQS signal. Similar principles apply to communication between one of the data buffers and its corresponding memory submodule. The transmitting terminal uses a MDQS signal as the sampling clock signal and transmits it along with a MDQ signal, which acts as the data signal, to the receiving terminal, and the receiving terminal then samples the MDQ signal based on the received MDQS signal.

Within the main controller, the data buffers, and the memory submodules, there are registers for configuring DQS (or MDQS) preamble codes and DQ (or MDQ) redundancy codes. Detailed information about the DQS preamble codes and the DQ redundancy codes will be provided below.

Figure 1B:
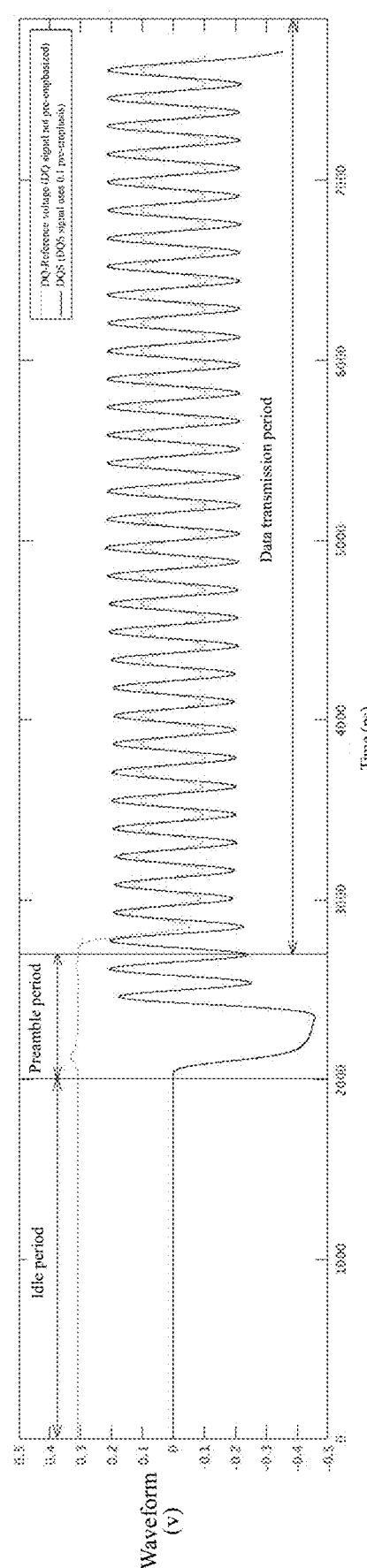
FIG. 1B is a waveform diagram showing communication between a transmitting terminal and a receiving terminal by adopting a source synchronous clock transmission according to an embodiment of the present disclosure.

FIG. 1B is a waveform diagram showing communication between a transmitting terminal and a receiving terminal by adopting a source synchronous clock transmission. The transmitting terminal can be one of the main controller, the data buffers, and the memory submodules shown in FIG. 1A. When the transmitting terminal is the main controller or one of the memory submodules, the receiving terminal is a corresponding one of the data buffers. Conversely, when the transmitting terminal is one of the data buffers, the receiving terminal is the main controller or a corresponding one of the memory submodules. An exemplary scenario where the main controller acts as the transmitting terminal and one of the data buffers acts as the receiving terminal is introduced. As shown in FIG. 1B, the main controller does not transmit data to this data buffer during an idle period. During a preamble period, the main controller transmits a DQS preamble code and a DQ redundancy code to the data buffer. Specifically, the DQS preamble code is configured for calibrating a DQS signal during a data transmission period (as shown in FIG. 1B), while the DQ redundancy code is the part of the DQ signal in the preamble period of the DQS signal. FIG. 1B illustrates an example where a pattern of the DQS preamble code is 00001010, and a pattern of the DQ redundancy code is 11111111. During the data transmission period, the main controller simultaneously transmits the DQS signal and the DQ signal to the data buffer, allowing the data buffer to sample the DQ signal based on the received DQS signal.

Due to the burst mode of the DQ interface, the DQS signal requires some time to stabilize, during which time the DQS signal exhibits jitter. As shown in FIG. 1B, there is significant jitter difference between the DQS signal and the DQ signal. In a source synchronous clock transmission system, the jitter of the DQS signal alone may have minimal impact on timing, while the jitter difference between the DQS signal and the DQ signal significantly affects timing.

Figure 1C:
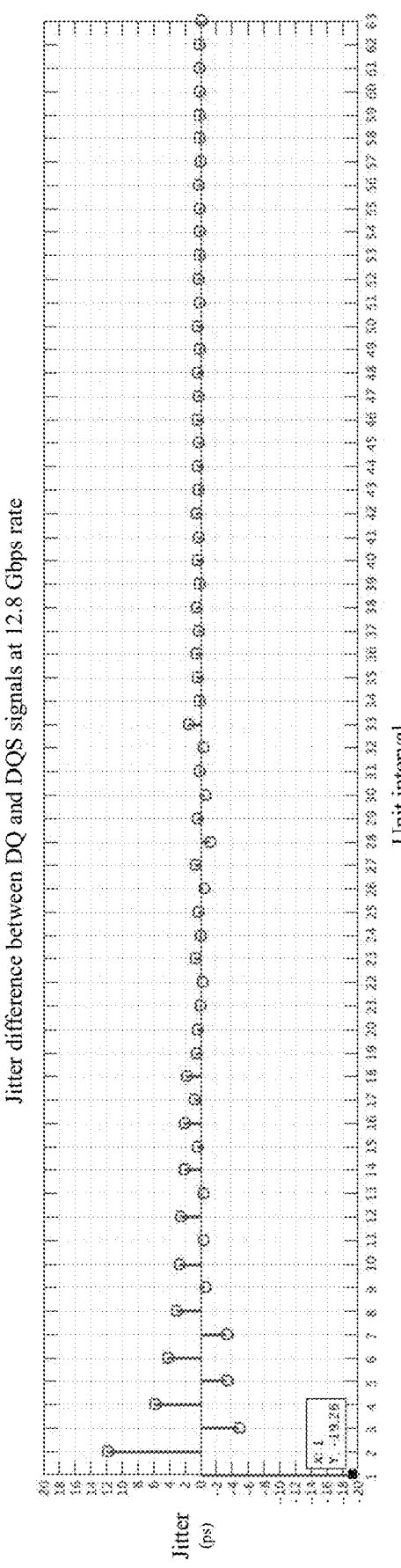
FIG. 1C is a diagram showing jitter difference between a DQS signal and a DQ signal in FIG. 1B.

FIG. 1C highlights the jitter difference between the DQS signal and the DQ signal in FIG. 1B. As shown in FIG. 1C, the jitter difference between the DQS signal and the DQ signal in the initial several unit intervals is pronounced, which persist across more than thirty unit intervals before settling. The jitter difference affects timing margins, leading to timing loss and impacting the accuracy of data sampling at the receiving terminal.

Figure 1D:
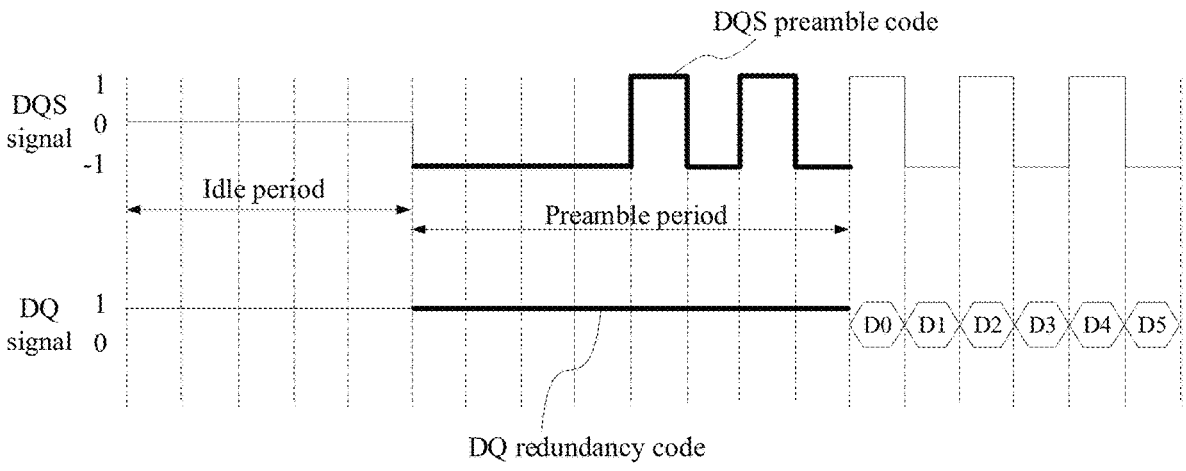
FIG. 1D shows a waveform diagram of a DQS signal and a DQ signal according to an embodiment of the present disclosure.

Furthermore, different patterns of the DQ redundancy code and the DQS preamble code result in varying jitter differences. In some embodiments, as shown in FIG. 1D, the pattern of the DQ redundancy code may be 11111111, the pattern of the DQS preamble code may be 00001010, and channel responses for the DQ signal and the DQS signal are similar. During the preamble period, the consistency between the patterns of the DQ redundancy code and the DQS preamble code is poor, inter-symbol interferences experienced by the DQ signal and the DQS signal is quite different, resulting in substantial jitter difference between the DQ signal and the DQS signal.

To address the above issues, the present disclosure further provides a signal transmitting method. The signal transmitting method of the present disclosure configures the DQ redundancy code with a specific pattern, which allows the jitter of the DQ signal to track the jitter of the DQS signal, reducing the jitter difference between the DQ signal and the DQS signal and minimizing timing loss of the receiving terminal.

The present disclosure will be described in further detail below with reference to the accompanying drawings.

Figure 2:
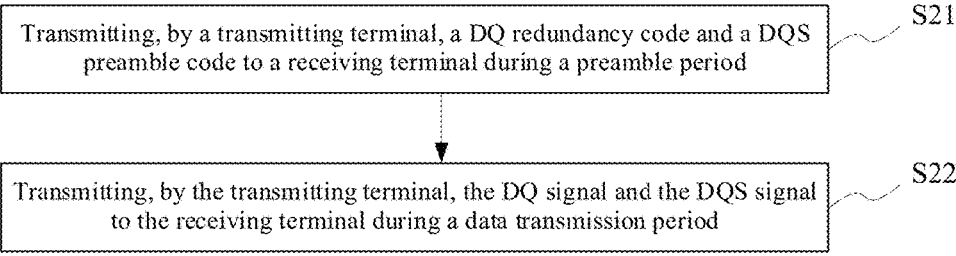
FIG. 2 shows a flowchart of a signal transmitting method according to an embodiment of the present disclosure.

FIG. 2 shows a flowchart of a signal transmitting method according to an embodiment of the present disclosure. The signal transmitting method is applied to a transmitting terminal of a source synchronous clock transmission system. As shown in FIG. 2, the signal transmitting method comprises steps S21 and S22.

S21 includes transmitting, by a transmitting terminal, a DQ redundancy code and a DQS preamble code to a receiving terminal during a preamble period. The DQ redundancy code is configured with a specific pattern such that jitter of a DQ signal tracks jitter of a DQS signal. In some embodiments, when the DQ redundancy code has the specific pattern, the lowest n bits of a pattern of the DQ redundancy code match the lowest n bits of a pattern of the DQS preamble code, where n is an integer greater than or equal to two. For example, when the lowest two bits of the pattern of the DQS preamble code are configured as 10, the lowest two bits of the pattern of the DQ redundancy code can also be configured as 10. As the lowest two bits of the pattern of the DQ redundancy code are configured to match the lowest two bits of the pattern of the DQS preamble code, a channel response of the DQ signal becomes similar to that of the DQS signal, and both the DQ and DQS signals experience similar inter-symbol interference, reducing jitter difference between the DQ signal and the DQS signal.

In some embodiments, the transmitting terminal is provided with a register to configure the DQ redundancy code with the specific pattern.

S22 includes transmitting, by the transmitting terminal, the DQ signal and the DQS signal to the receiving terminal during a data transmission period.

Figure 3:
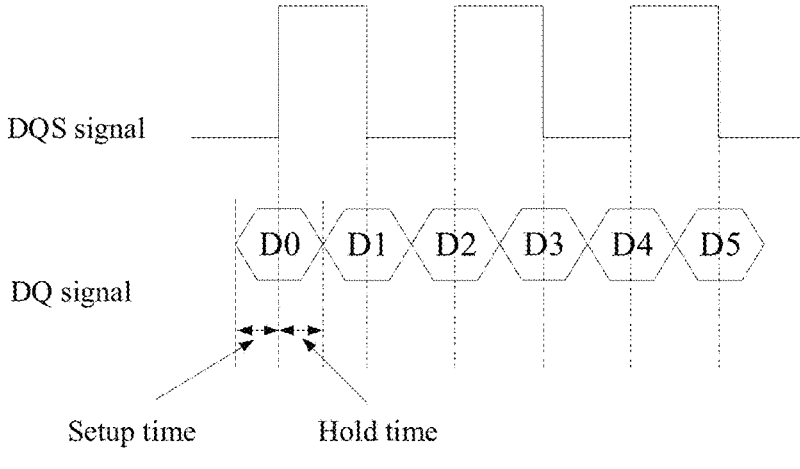
FIG. 3 shows a diagram of a DQS signal and a DQ signal according to an embodiment of the present disclosure.

In some embodiments, the transmitting terminal synchronously transmits both the DQ signal and the DQS signal, and the receiving terminal utilizes rising and falling edges of the DQS signal to sample DQ data. To achieve accurate sampling, the receiving terminal shall satisfy requirements for setup time and hold time on DQ data sampling. FIG. 3 shows a diagram of the DQS signal and the DQ signal according to an embodiment of the present disclosure. Specifically, the setup time refers to a time interval that the DQ signal need be stable and held at an appropriate voltage level before the sampling. The hold time refers to a time interval that the DQ signal need be held at the appropriate voltage level after the sampling. When the DQ signal remains unchanged, if the DQS signal shifts forward due to its jitter (i.e., the sampling time is advanced), it will reduce the setup time; conversely, if the DQS signal shifts backward due to its jitter (i.e., the sampling time is delayed), it will reduce the hold time. Both scenarios can lead to sampling errors. However, in the present disclosure, by configuring the DQ redundancy code with the specific pattern, the jitter of the DQ signal can track the jitter of the DQS signal. Specifically, when the DQS signal shifts forward due to its jitter, the DQ signal also shifts forward, keeping the setup time and hold time substantially unchanged. Similarly, when the DQS signal shifts backward due to its jitter, the DQ signal also shifts backward, maintaining the setup time and hold time substantially unchanged. Therefore, the signal transmitting method of the present disclosure reduces the likelihood of sampling errors and minimizes timing loss of the received signals.

In some embodiments, a channel between the transmitting terminal and the receiving terminal is a linear time-invariant channel. Based on superposition principles of the linear time-invariant channel, the jitter of the DQ signal comprises basic jitter corresponding to basic pattern and additional jitter corresponding to other patterns. For example, when the basic pattern is configured as 1010, the other pattern can be configured as any pattern other than 1010. The register disposed in the transmitting terminal configures the DQ redundancy code with the specific pattern, to reduce jitter difference between the DQ signal and the DQS signal in terms of the basic jitter and the additional jitter, respectively.

In some embodiments, the lowest n bits of the pattern of the DQ redundancy code are configured to match the lowest n bits of the pattern of the DQS preamble code, where n is an integer greater than two and less than or equal to m, wherein m represents the total bits of the pattern of the DQ redundancy code. That is, when the patterns of the DQ redundancy code and the DQS preamble code share more matching bits (more than two bits), the patterns become increasingly similar, resulting in smaller jitter difference.

Figure 4A:
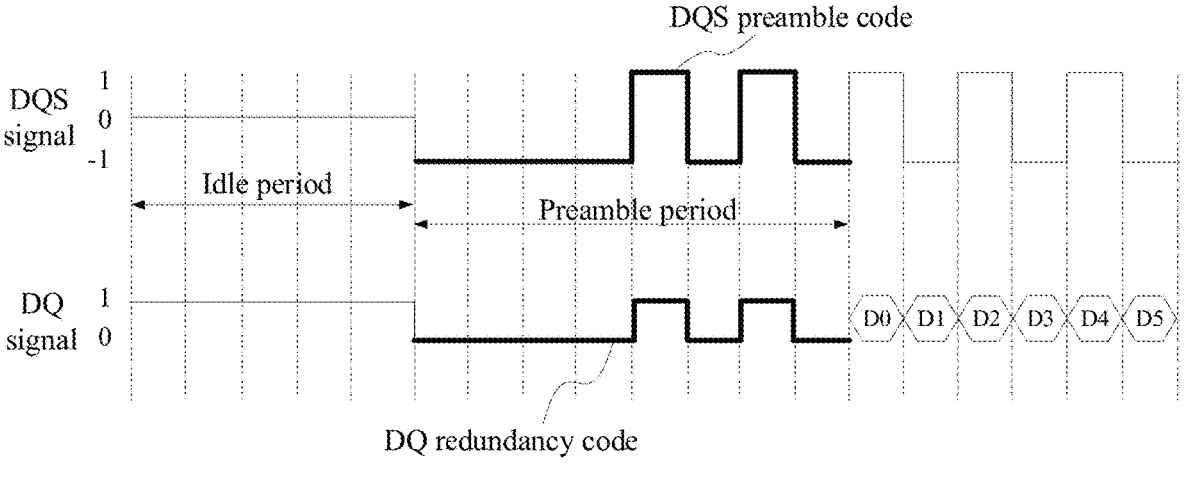
FIG. 4A shows a waveform diagram of a DQS signal and a DQ signal according to an embodiment of the present disclosure.
Figure 4B:
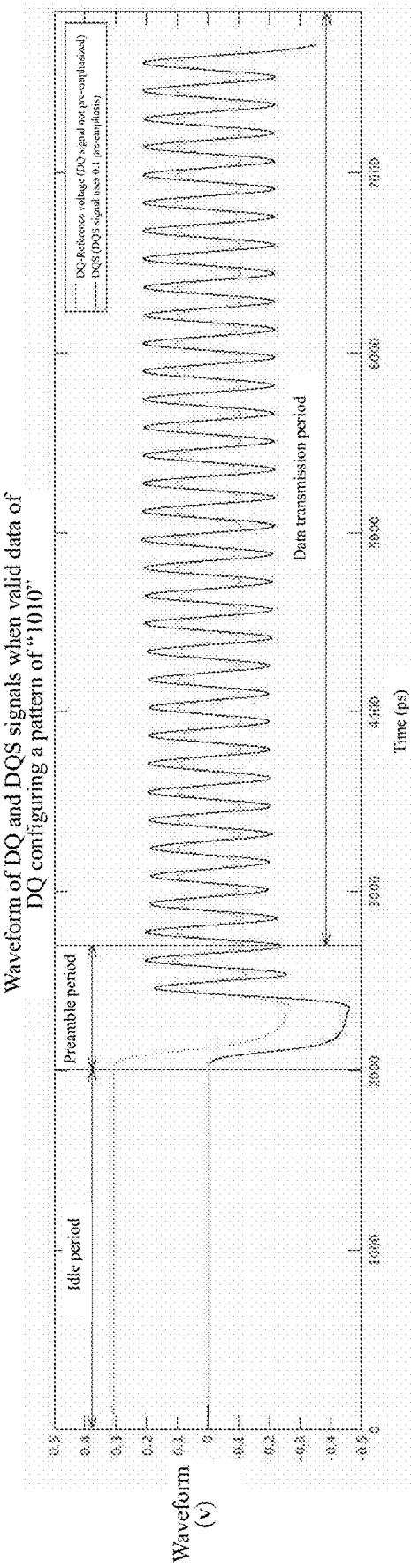
FIG. 4B shows another waveform diagram of the DQS signal and the DQ signal according to the embodiment of the present disclosure.
Figure 4C:
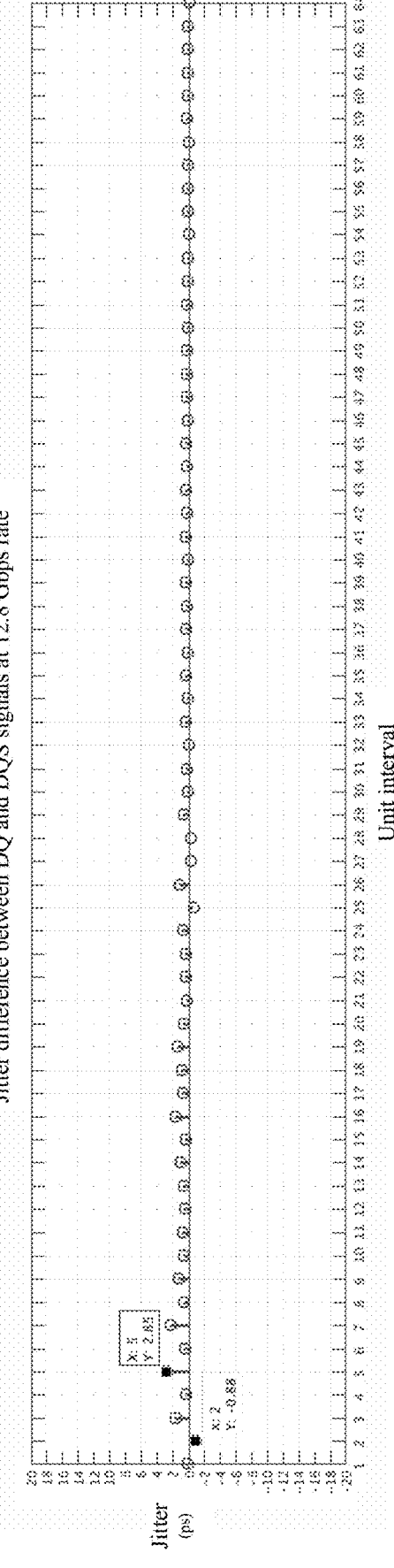
FIG. 4C is a diagram showing jitter difference between the DQS signal and the DQ signal.

In some embodiments, referring to FIG. 4A, the DQS preamble code has a pattern of 00001010, and the DQ redundancy code is configured with the same pattern, such that the channel response of the DQ signal becomes similar to that of the DQS signal. FIG. 4B shows another waveform diagram of the DQS signal and the DQ signal according to the embodiment of FIG. 4A, and FIG. 4C is a diagram showing the jitter difference between the DQS signal and the DQ signal. During the preamble period, the pattern of the DQ redundancy code is consistent with the pattern of the DQS preamble code. As the DQ signal and the DQS signal experience similar inter-symbol interferences, the jitter difference between the DQ signal and the DQS signal can be reduced, minimizing timing loss.

Figure 5A:
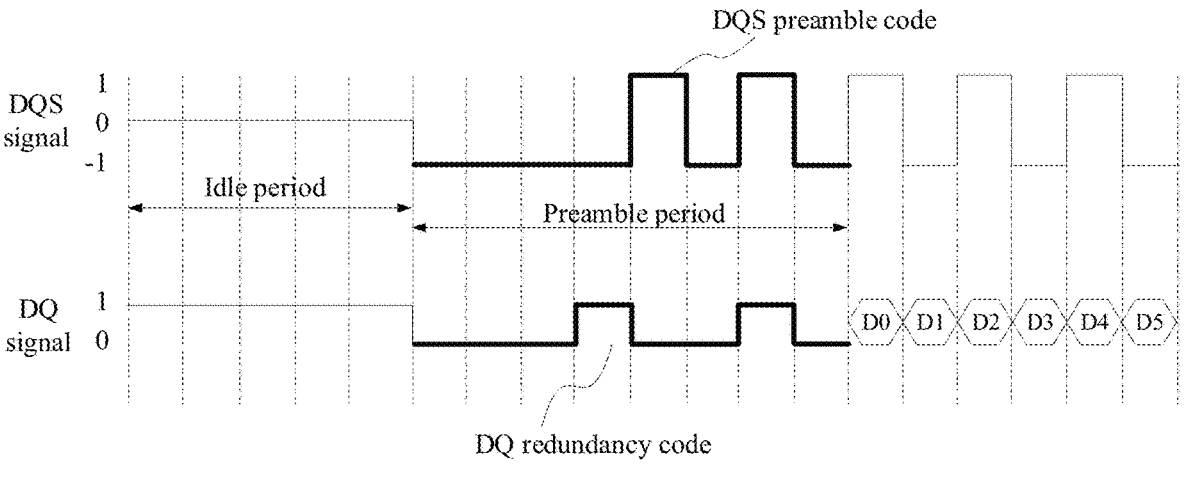
FIG. 5A shows a waveform diagram of a DQS signal and a DQ signal according to another embodiment of the present disclosure.
Figure 5B:
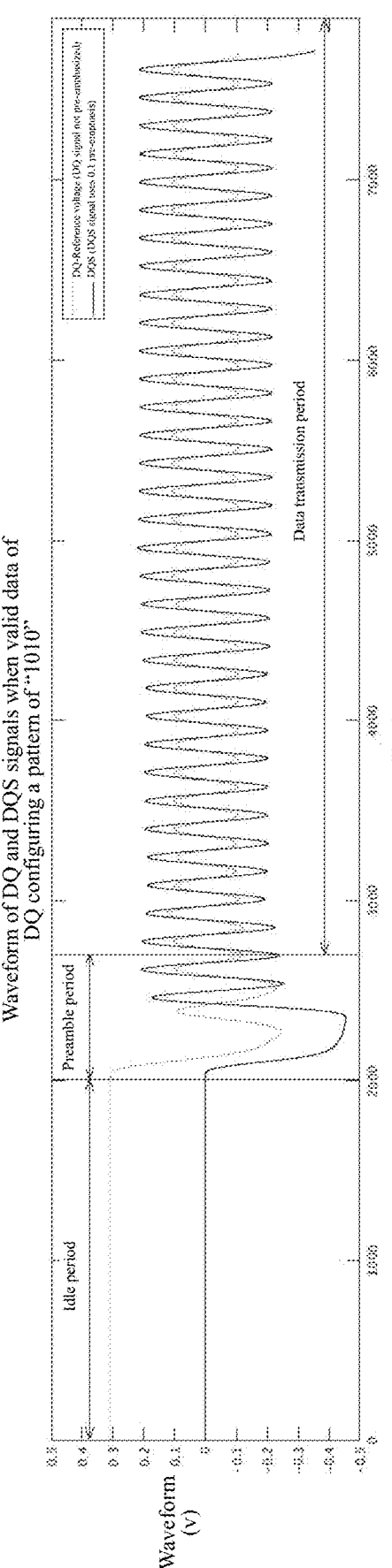
FIG. 5B shows another waveform diagram of the DQS signal and the DQ signal according to another embodiment of the present disclosure.
Figure 5C:
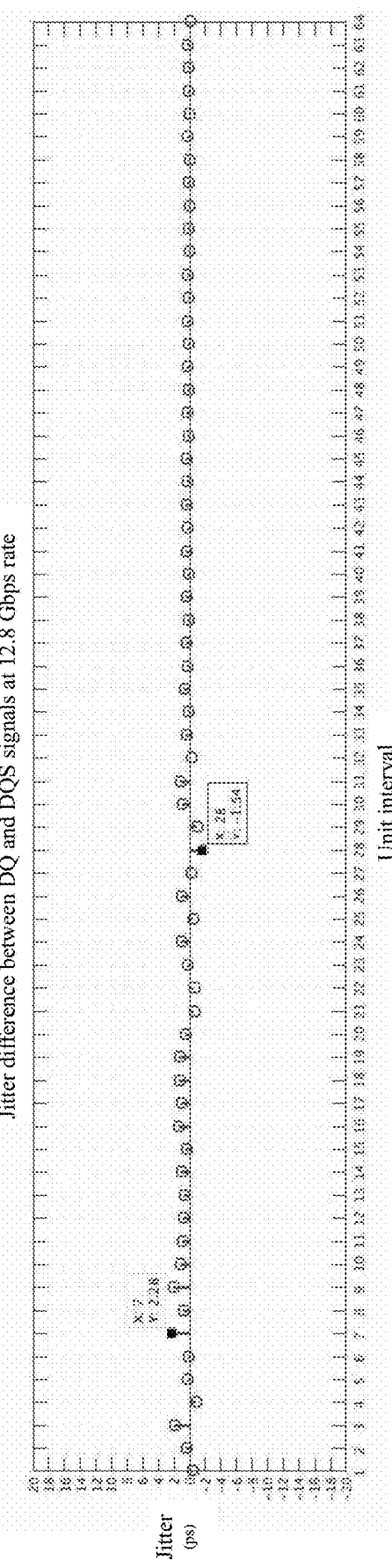
FIG. 5C is a diagram showing jitter difference between the DQS signal and the DQ signal.

In some embodiments, referring to FIG. 5A, the DQS preamble code has a pattern of 00001010, and the DQ redundancy code has a pattern of 00010010, such that the channel response of the DQ signal becomes similar to that of the DQS signal. FIG. 5B shows another waveform diagram of the DQS signal and the DQ signal according to the embodiment of FIG. 5A, and FIG. 5C is a diagram showing the jitter difference between the DQS signal and the DQ signal. During the preamble period, the pattern of the DQ redundancy code is similar to the pattern of the DQS preamble code. As the DQ signal and the DQS signal experience similar inter-symbol interferences, the jitter difference between the DQ signal and the DQS signal can be reduced, minimizing timing loss.

It should be noted that the above-mentioned patterns of the DQ redundancy code and the DQS preamble code are merely illustrative.

The scope of the signal transmitting method described in the present disclosure is not limited to the sequence of operations listed herein. Any scheme realized by adding or subtracting operations or replacing operations of the traditional techniques according to the principle of the present disclosure is included in the scope of the present disclosure.

Figure 6:
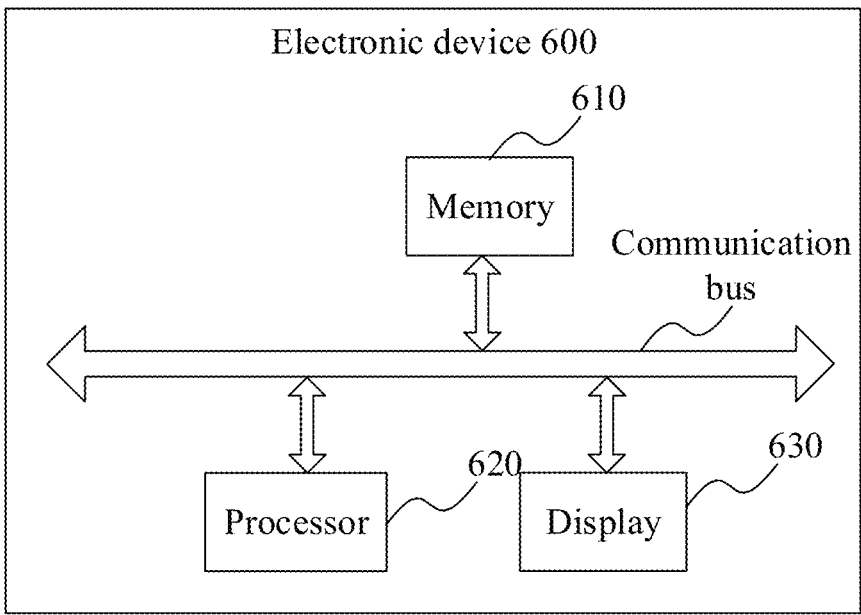
FIG. 6 shows a schematic diagram of an electronic device according to an embodiment of the present disclosure.

The present disclosure further provides an electronic device. FIG. 6 shows a schematic diagram of an electronic device 600 according to an embodiment of the present disclosure. As shown in FIG. 6, the electronic device 600 comprises a memory 610 and a processor 620.

The memory 610 is configured to store a computer program. In some possible embodiments, the memory 610 may comprise one or more of a ROM, RAM, magnetic disk, U disk, memory card, optical disk, or other medium that can store program codes.

In the present disclosure, the memory 610 may comprise a volatile computer-readable storage medium, such as RAM and/or cache memory. The electronic device 600 may further comprise other removable/non-removable, volatile/nonvolatile computer system storage media. The memory 610 may comprise at least one program product, and the program product has a group of (for example, at least one) program modules, and these program modules are configured to implement the functions of the embodiments of the present disclosure.

The processor 620 is connected to the memory 610 for executing the computer program stored in the memory 610, to cause the electronic device 600 to perform the signal transmitting method described above.

In some embodiments, the processor 620 may be a general processor, including a central processing unit (CPU), a network processor (NP), and the like. In other embodiments, the processor 620 may also be a digital signal processor (DSP), an application specific integrated circuit (ASIC), a field programmable gate array (FPGA), or other programmable logic devices, discrete gate or transistor logic devices, or discrete hardware components.

In some possible embodiments, the electronic device 600 of the present disclosure may further comprise a display 630. The display 630 is communicatively connected to the memory 610 and the processor 620 for displaying a graphical user interface (GUI) related to the signal transmitting method.

In the present disclosure, the display 630 may be a display screen (or, a display panel). In some embodiments, the display panel can be configured using technologies such as liquid crystal display (LCD), organic light-emitting diode (OLED), or the like. Additionally, the display 630 may be a touch panel (or, touch screen), which includes both a visual screen and a touch-sensitive surface. When the touch-sensitive surface detects touch interactions on or near it, the information will be transmitted to the processor 620 to determine the type of touch event, and then the processor 620 provides corresponding visual output on the display 630, based on the type of touch event.

The present disclosure further provides a communication system, which can be configured as a source synchronous clock transmission system. The communication system comprises a transmitting terminal and a receiving terminal. The transmitting terminal and the receiving terminal are connected to each other through DQ and DQS lines. The transmitting terminal is configured to transmit a DQ signal and a DQS signal to the receiving terminal by adopting the signal transmitting method described above. The receiving terminal is configured to receive the DQ signal and the DQS signal from the transmitting terminal, and to sample the DQ signal based on the DQS signal.

In summary, the signal transmitting method of the present disclosure configures the DQ redundancy code with the specific pattern, which allows the jitter of the DQ signal to track the jitter of the DQS signal, reducing the jitter difference between the DQ signal and the DQS signal and minimizing timing loss of the receiving terminal. In addition, the present disclosure further provides improved patterns for the DQ redundancy code and DQS preamble code, which helps to reduce the jitter difference, increase timing margins for the received signals, and reduce timing loss, addressing various limitations in existing technologies and offering significant industrial value.

The above-mentioned embodiments only exemplarily illustrate the principles and effects of the present disclosure, but are not used to restrict the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

The invention claimed is:

1. A signal transmitting method, comprising:
transmitting, by a transmitting terminal, a DQ redundancy code and a DQS preamble code to a receiving terminal during a preamble period, wherein the DQ redundancy code is configured with a specific pattern such that jitter of a DQ signal tracks jitter of a DQS signal, wherein when the DQ redundancy code has the specific pattern, the lowest n bits of a pattern of the DQ redundancy code match the lowest n bits of a pattern of the DQS preamble code, wherein n is an integer greater than or equal to two;
transmitting, by the transmitting terminal, the DQ signal and the DQS signal to the receiving terminal during a data transmission period.

2. The signal transmitting method according to claim 1, wherein a channel between the transmitting terminal and the receiving terminal is a linear time-invariant channel, and the jitter of the DQ signal comprises basic jitter corresponding to basic pattern and additional jitter corresponding to other patterns, wherein the transmitting terminal is provided with a register to configure the DQ redundancy code with the specific pattern, to reduce jitter difference between the DQ signal and the DQS signal in terms of the basic jitter and the additional jitter, respectively.

3. The signal transmitting method according to claim 1, wherein the pattern of the DQ redundancy code and the pattern of the DQS preamble code are stored in a register, and the signal transmitting method further comprises obtaining the pattern of the DQ redundancy code and the pattern of the DQS preamble code from the register.

4. The signal transmitting method according to claim 1, wherein n is an integer greater than two.

5. The signal transmitting method according to claim 1, wherein the pattern of the DQS preamble code is 00001010, and the lowest two bits of the pattern of the DQ redundancy code are 10.

6. The signal transmitting method according to claim 5, wherein the pattern of the DQS preamble code is 00001010, and the pattern of the DQ redundancy code is 00001010 or 00010010.

7. The signal transmitting method according to claim 1, wherein the signal transmitting method is applied to a source synchronous clock transmission system.

8. An electronic device, comprising:

a memory, on which a computer program is stored; and a processor, communicatively connected to the memory and configured to call the computer program to perform the signal transmitting method according to claim 1.

9. A communication system, comprising:

a transmitting terminal, configured to transmit signals to a receiving terminal by adopting the signal transmitting method according to claim 1; and the receiving terminal, configured to receive the signals from the transmitting terminal.

\*　\*　\*　\*　\*